United States Patent [19]
Taki

[11] Patent Number: 6,005,418
[45] Date of Patent: Dec. 21, 1999

[54] LOW POWER CONSUMING LOGIC CIRCUIT

[75] Inventor: Kazuo Taki, Hyogo, Japan

[73] Assignee: Yugen Kaisha A.I.L., Tokyo, Japan

[21] Appl. No.: 08/763,743

[22] Filed: Dec. 11, 1996

[51] Int. Cl.$^6$ ...................... H03K 19/094; H03K 19/096
[52] U.S. Cl. .......................... 326/113; 326/113; 326/121; 326/83; 326/86; 326/95; 326/98; 326/28
[58] Field of Search .................................... 326/113, 121, 326/95, 98, 28, 83, 86; 327/389, 391

[56] References Cited

U.S. PATENT DOCUMENTS

| | | |
|---|---|---|
| 4,541,067 | 9/1985 | Whitaker . |
| 4,622,648 | 11/1986 | Whitaker . |
| 5,073,727 | 12/1991 | Shizu ....................................... 326/121 |
| 5,148,387 | 9/1992 | Yano et al. . |
| 5,399,924 | 3/1995 | Goetting et al. ......................... 326/121 |
| 5,404,151 | 4/1995 | Asada ........................................ 326/98 |
| 5,548,231 | 8/1996 | Tran . |
| 5,581,202 | 12/1996 | Yano et al. . |
| 5,606,270 | 2/1997 | D'Souza et al. ......................... 326/121 |
| 5,859,548 | 1/1999 | Kong ........................................ 326/113 |

Primary Examiner—Michael Tokar
Assistant Examiner—James H. Cho
Attorney, Agent, or Firm—Marshall, O'Toole, Gerstein, Murray & Borun

[57] ABSTRACT

Disclosed is a low power consuming logic circuit to restrain a short circuit current which flows within an inverter circuit of an inverter having a clock input connected behind a pass-transistor logic circuit. In the logic circuit, the inverter having a clock input is provided on the output of a pass-transistor logic circuit. The inverter having a clock input includes the inverter circuit and write control means. A data holding circuit is connected to the output of the write control means. In the logic circuit, a clock is input to the inverter having a clock input after the output of the pass-transistor logic circuit is stabilized. Thus, the short circuit current which flows in the inverter circuit is restrained. In addition to the logic circuit, a positive feedback circuit for supplying an inverted signal from the inverter circuit to the output of the inverter having a clock input can be provided. In the logic circuit, the positive feedback circuit functions to further increase the voltage of the output signal of the pass-transistor logic circuit if it is higher than the input threshold of the inverter, and to further reduce the same voltage if it is lower than the input threshold of the inverter. Consequently, the short circuit current flows in the inverter having a clock input in a very short time.

13 Claims, 9 Drawing Sheets

LOW POWER CONSUMING LOGIC CIRCUIT

BACKGROUND OF THE INVENTION

1. Field of the Invention

The present invention relates to a circuit technique for designing a LSI, and more particularly to a low power consuming logic circuit which is used as a circuit element on a LSI chip in order to implement a LSI which consumes less power.

2. Background of the Invention

A pass-transistor logic which is a kind of a logic circuit is formed by using a MOS transistor as a selection switch for an input signal, and has been known as a logic circuit which can implement a logic having the same functions with a smaller number of transistors than a CMOS logic that has been used most widely, and which can perform operation at high speed with less power consumption. The characteristics and examples of the circuit have been disclosed in "The white paper concerning a technique of low power consuming LSI (ed. by Nikkei Micro Device, Nikkei B.P. Corp.)", pages 98 to 104.

Figure 6:
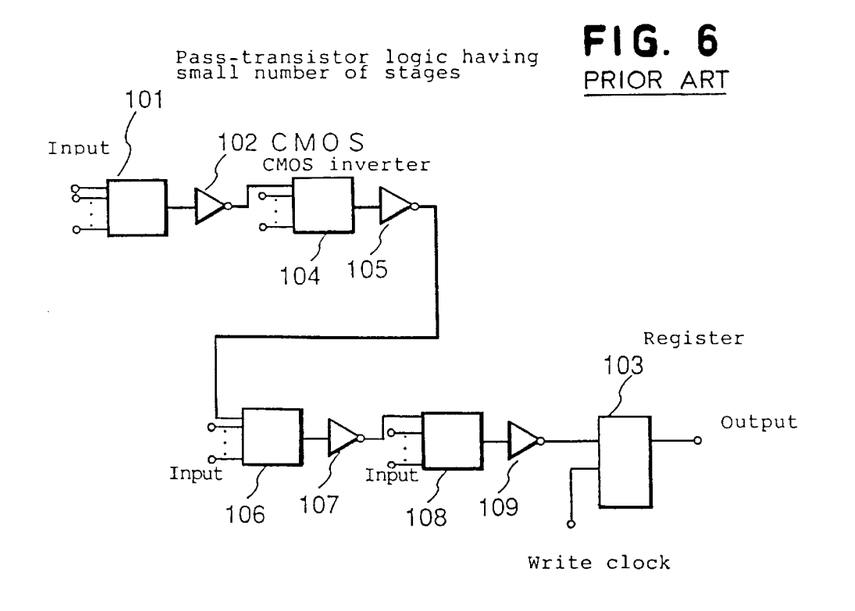
FIG. 6 is a diagram showing the structure of a logic circuit comprising a pass-transistor logic circuit according to the prior art.

In the prior art, a logic circuit using the pass-transistor logic has had a structure in which a CMOS inverter 102 is connected behind a pass-transistor logic circuit 101 having a small number of stages as shown in FIG. 6 so as to make a set, the similar set is connected in multistage to implement a desired logic, and a logic signal thus obtained is written to a register 103 provided on the next stage. The register 103 performs writing when an effective write clock signal is input.

Figure 7:
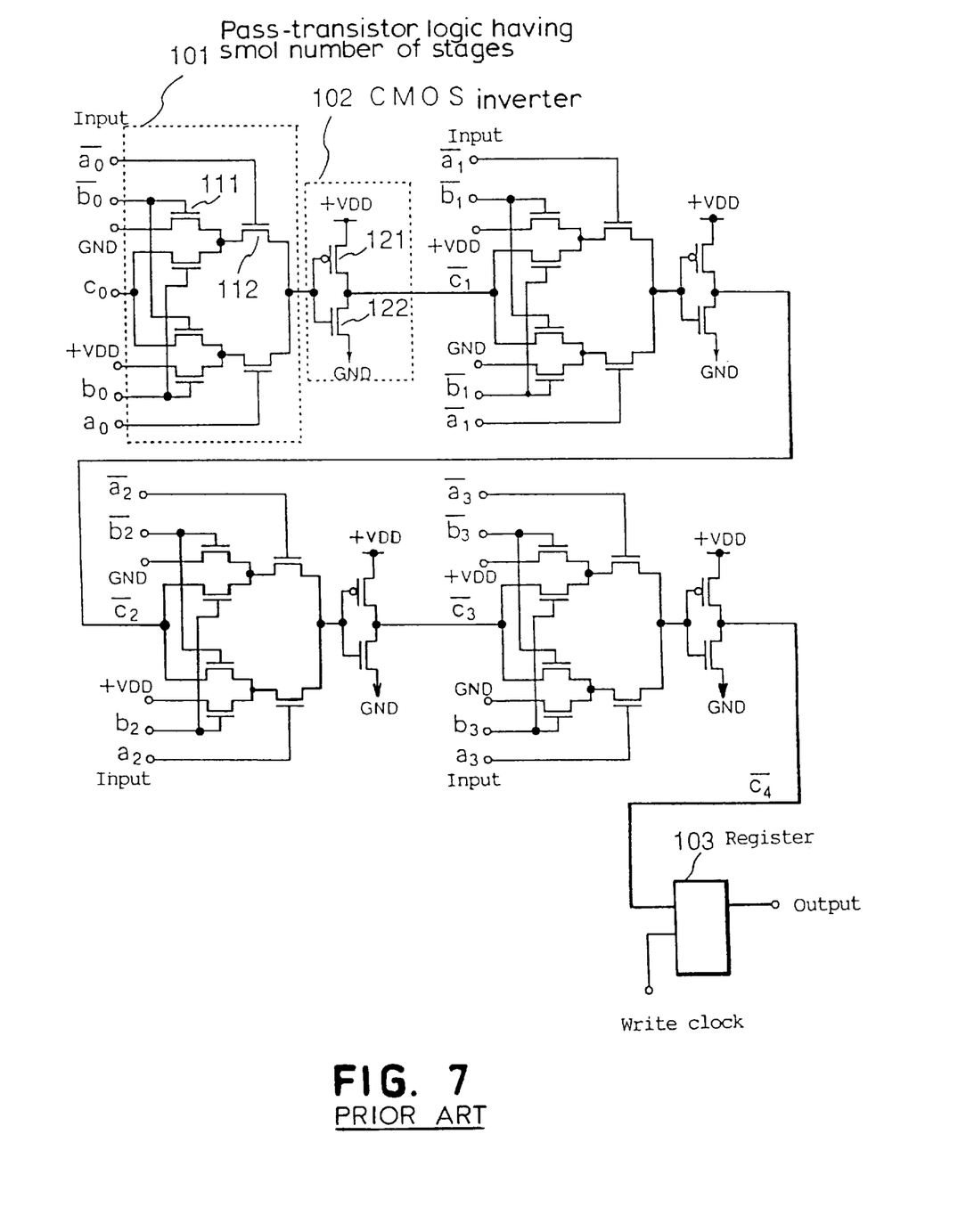
FIG. 7 is a circuit diagram showing a logic circuit comprising a pass-transistor logic circuit according to the prior art.

FIG. 7 illustrates the circuit structure of FIG. 6 in more detail. In FIG. 7, a most significant carry circuit of a 4-bit full adder is illustrated as an example. In the example of FIG. 7, a circuit in which only two stages of NMOS pass-transistors are connected is used as the pass-transistor logic circuit 101 having a small number of stages. For example, NMOS pass-transistors 111 and 112 are counted as 2 stages. As the number of connection stages is smaller, the voltage of a signal output from a pass-transistor on the final connection stage is changed more rapidly. As the number of the connection stages is increased more, the voltage of the output signal is changed more slowly. The CMOS inverter 102 serves to cause the voltage of the signal output from the pass-transistor logic circuit 101 having a small number of stages to be changed more rapidly. Accordingly, the examples according to the prior art shown in FIGS. 6 and 7 have structures suitable for high-speed operation in which the signal voltage in the circuit can be always changed rapidly because the number of connection stages of the pass-transistors is limited to two or three and the CMOS inverter is provided behind them.

However, in the case where the circuits according to the prior art shown in FIGS. 6 and 7 are used as low power consuming logic circuits, the following problems arise.

In the case where a source voltage and an operating frequency are set to the same conditions, the consumed power of the circuit shown in FIGS. 6 and 7 is influenced by the total numbers of transistors and CMOS inverters in the circuit. As the former, the total number of transistors, is increased, the consumed power also tends to be increased. The reason is that charging and discharging of a parasitic capacitor of the transistor cause large power consumption. Regarding the latter, when a CMOS inverter 102 operates, a short circuit current flows from a +VDD to a GND through a PMOS transistor 121 and an NMOS transistor 122 in the process where the signal voltage is changed. The short circuit current is the cause of the power consumption. As the number of the CMOS inverters is increased, the consumed power is also increased. In the case where a reduction in the power consumption is more important than high-speed operation, it seems to be desirable that CMOS inverters 102, 105 and 107 are removed leaving a CMOS inverter 109 which is provided immediately before a register 103 in the circuits shown in FIGS. 6 and 7. Consequently, it seems that the power consumption can be reduced greatly by reducing the numbers of the transistors and the CMOS inverters. The remaining CMOS inverter 109 is necessary for ensuring the operation of the register 103.

However, the above-mentioned method has omissions to result in an increase in the power consumption, which is caused by the characteristics of the CMOS inverter. As described above, the CMOS inverter outputs an input signal such that the voltage thereof is changed more rapidly. In this case, as the voltage of the input signal is changed slowly, the magnitude of the short circuit current is increased rapidly. In more detail, the short circuit current flows in the CMOS inverter only when the voltage of the signal input to the CMOS inverter has an intermediate value which is neither sufficiently high nor low. For example, the short circuit current flows in the CMOS inverter 102 only when the voltage of the input signal is lower than the threshold voltage of the PMOS transistor 121 and is higher than the threshold voltage of the NMOS transistor 122. Accordingly, as the voltage of the input signal rises or drops slowly, the time for which the voltage of the input signal has the intermediate value is increased rapidly. Consequently, the time for which the short circuit current flows is increased proportionally. As a result, the power consumption is increased.

If the three CMOS inverters are removed by the above-mentioned method, pass-transistor logic circuits 101, 104, 106 and 108 having a small number of stages are directly connected to one another. Consequently, the number of connection stages of NMOS pass-transistors is increased from 2 to 8. As a result, the voltage of a signal output from a pass-transistor provided on the final stage is changed very slowly. This signal is input to the CMOS inverter 109. Consequently, the short circuit current of the CMOS inverter 109 is increased greatly. Thus, the power consumption is increased much more than the effects of power reduction which are obtained by removing the three CMOS inverters.

In order to solve the above-mentioned problems and obtain a low power consuming logic circuit, thus, it is necessary to implement a circuit structure in which a short circuit current having a high magnitude does not flow to a CMOS inverter also in the case where the voltage of the signal input to the CMOS inverter is changed slowly. The present invention has been made to implement this circuit structure.

SUMMARY OF THE INVENTION

Figure 1:
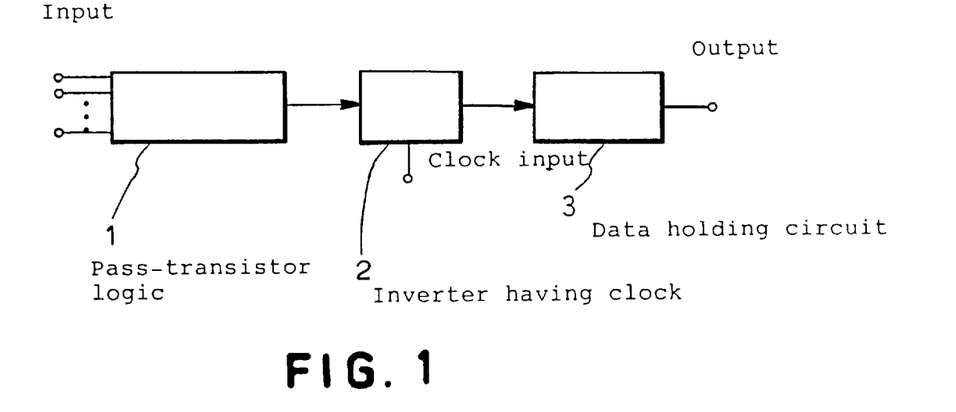
FIG. 1 is a block diagram showing the structure of a low power consuming logic circuit according to the present invention.

FIG. 1 shows a block diagram of a low power consuming logic circuit according to the present invention. In the logic circuit according to the present invention, the output of a pass-transistor logic circuit 1 is connected to an inverter 2 having a clock input, and the output of the inverter 2 having a clock input is connected to a data holding circuit 3. By this connection, the clock input to the inverter 2 can be also used as a write control signal to the data holding circuit 3. The inverter 2 having a clock input operates as an inverter only when a clock input signal is sent. In other cases, the inverter 2 having a clock input is kept in the operation stopping state so that the output thereof is brought into the non-connection state.

A method for solving the above-mentioned problems will be described below in accordance with the present invention. The inverter 2 having a clock input operates as an inverter only when a clock is input, and is kept in the operation stopping state in other cases. In these cases, the output is equivalently kept in the disconnected state. When the input of the pass-transistor logic circuit 1 is changed, the voltage of an output signal slowly starts to be changed slightly later, passes through an immediate value thereof and is brought into the state in which a voltage value is sufficiently high or low. Then, a clock input signal is sent to the inverter 2 having a clock input. Consequently, the inverter 2 having a clock input operates as an ordinary inverter, and outputs a signal which is obtained by inverting the output signal of the pass-transistor logic circuit 1. Thus, a signal value which is held by the data holding circuit 3 is rewritten. In this case, the inverter 2 having a clock input starts to operate after the voltage of the output signal of the pass-transistor logic circuit 1 is set to a sufficiently high or low value. For this reason, a short circuit current never flows to the inverter 2 having a clock input. Consequently, power consumption which is based on the short circuit current can be eliminated. As a result, it is possible to implement a low power consuming logic circuit which solves the above-mentioned problems.

Figure 2:
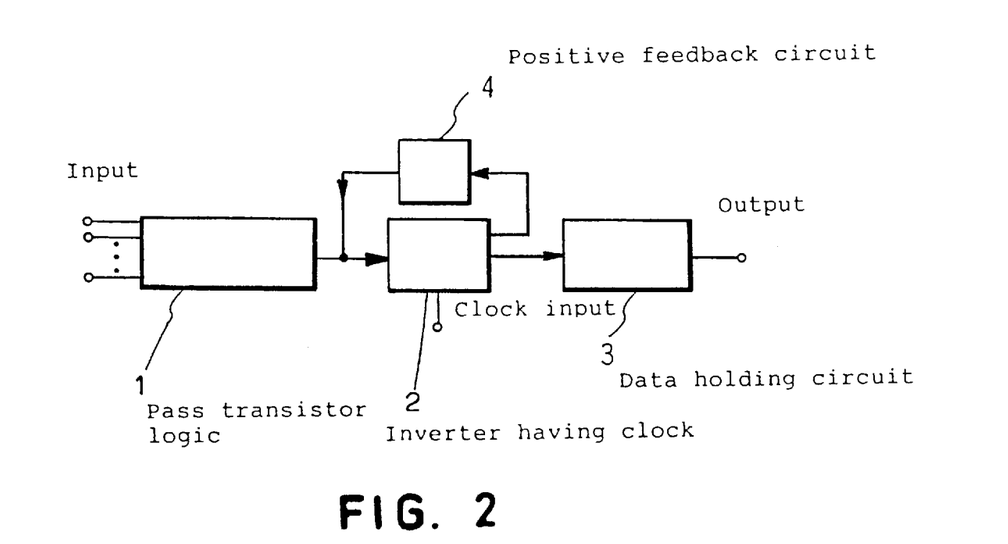
FIG. 2 is a block diagram showing the structure of a low power consuming logic circuit which comprises a positive feedback circuit according to the present invention.

FIG. 2 shows another block diagram of the low power consuming logic circuit according to the present invention. The logic circuit shown in FIG. 2 is formed by additionally connecting, to the circuit shown in FIG. 1, a positive feedback circuit 4 which supplies an inverted signal from a second output to an input. The positive feedback circuit 4 operates only when a clock pulse enters the inverter 2 having a clock input.

A method for solving the above-mentioned problems will be described below in accordance with the present invention. The operation of the inverter 2 having a clock input has been described above. When the input of a pass-transistor logic circuit 1 is changed, the voltage of an output signal slowly starts to be changed slightly later, passes through the intermediate value thereof, and tries to be brought into the state in which a voltage value is sufficiently high or low. While the voltage of the output signal of the pass-transistor logic circuit 1 has the intermediate value before it is brought into the final state, a clock input signal is sent to the inverter 2 having a clock input. It is necessary for the intermediate value to exceed a certain threshold and approximate the final value of the voltage of the output signal. When the clock input signal is sent, the inverter 2 having a clock input operates as an ordinary inverter to compare the input signal having the intermediate value with a threshold, decide whether a voltage is high or low, invert and amplify the input signal, and output the inverted and amplified signal. Thus, a signal value held by a data holding circuit 3 is rewritten. In this case, while the voltage of the output signal of the pass-transistor logic circuit 1 has the intermediate value, the inverter 2 having a clock input starts to operate. Accordingly, the short circuit current flows to the inverter 2 having a clock input. However, the positive feedback circuit 4 also starts to operate at the same time that the inverter 2 having a clock input starts to operate. The positive feedback circuit 4 serves to increase the speed at which the voltage of the output signal of the pass-transistor logic circuit 1 is changing slowly. Consequently, the value of the voltage of the output signal is quickly changed from the intermediate value to a final value. Thus, the short circuit current flows in the inverter 2 having a clock input for a very short time. Accordingly, the power consumption which is based on the short circuit current can be reduced. As a result, it is possible to implement a low power consuming logic circuit which solves the above-mentioned problems.

As compared with a logic circuit having no positive feedback circuit 4, the logic circuit having the positive feedback circuit 4 can give a clock input signal to the inverter 2 having a clock input in the earlier stage. Therefore, the logic circuit having the positive feedback circuit 4 is suitable for implementing a relatively high speed operating circuit in which a short clock cycle is used.

DETAILED DESCRIPTION OF THE PREFERRED EMBODIMENTS

Preferred examples of the present invention will be described below.

Figure 3A:
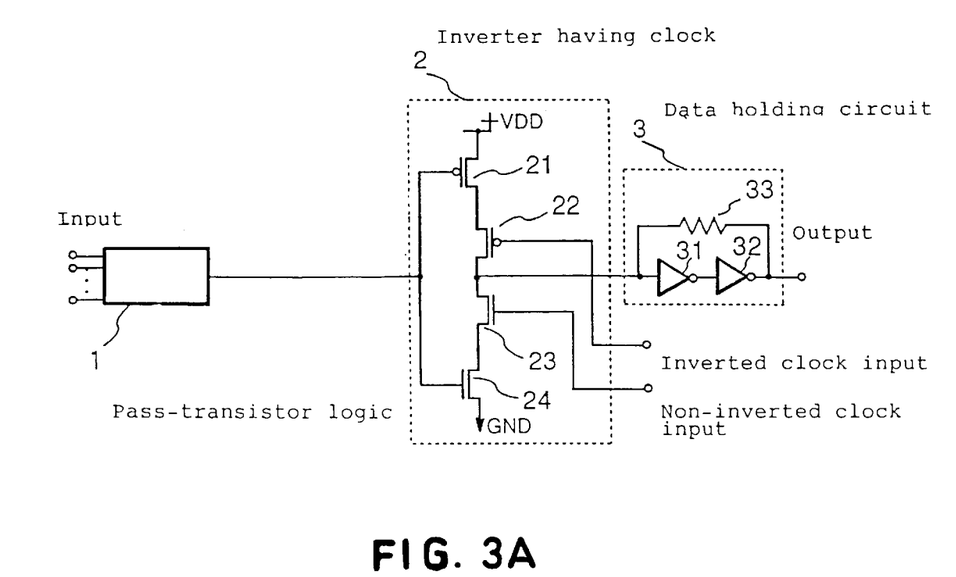
FIG. 3A is a circuit diagram showing a low power consuming logic circuit according to an example of the present invention.
Figure 3B:
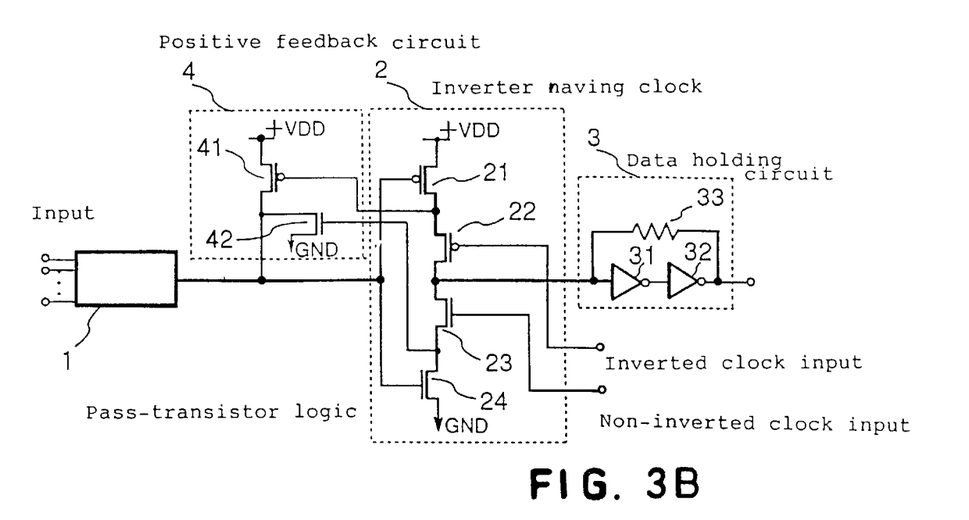
FIG. 3B is a circuit diagram showing an example of a low power consuming logic circuit which comprises a positive feedback circuit in accordance with the present invention.

FIG. 3A shows a specific example of a block circuit diagram in FIG. 1. FIG. 3B shows a specific example of a block circuit diagram in FIG. 2. A circuit shown in FIG. 3B is obtained by adding, to a circuit shown in FIG. 3A, a PMOS transistor 41 and an NMOS transistor 42 which form a positive feedback circuit 4. Each portion of the circuit shown in FIG. 3B will be described below in order. The corresponding portions have the same reference numbers as in the circuit shown in FIG. 3A.

Figure 4:
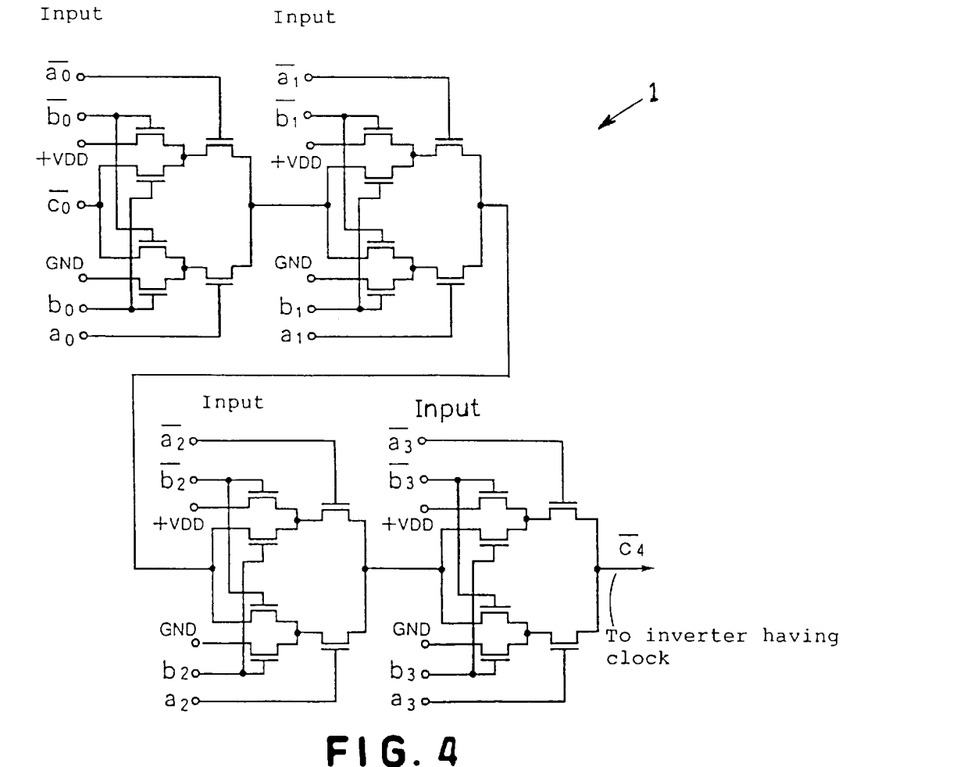
FIG. 4 is a diagram showing an example of a pass-transistor logic circuit.

An example of a pass-transistor logic circuit 1 is shown in FIG. 4. FIG. 4 shows a most significant carry circuit of a 4-bit full adder which is implemented by only NMOS pass-transistors. The largest number of stages of the connected pass-transistors is 8. In the present invention, it is assumed that the number of stages of the connected pass-transistors included in the pass-transistor logic circuit 1 is increased to some extent so that the voltage of the output signal of the pass-transistor logic circuit 1 is changed very slowly, that is, a voltage waveform rises or falls very slowly.

An example of the circuit of an inverter 2 having a clock input will be described below with reference to FIG. 3B. An output 1a of the pass-transistor logic circuit 1 is input to each gate of a PMOS transistor 21 and an NMOS transistor 24 which form an inverter circuit. A power supply (+VDD) is connected to the PMOS transistor 21 and a ground (GND) is connected to the NMOS transistor 24. A PMOS output enable transistor 22 and an NMOS output enable transistor 23 are connected between the transistors 21 and 24 in series. These transistors 21, 24, 22 and 23 form the inverter 2 having a clock input. The outputs of the transistors 22 and 23 are input to a data holding circuit 3.

The PMOS output enable transistor 22 and the NMOS output enable transistor 23 serve as switches which are closed when a clock pulse enters, and form write control means. An inverted clock pulse is given to the gate of the PMOS output enable transistor 22. A non-inverted clock pulse is given to the gate of the NMOS output enable transistor 23. In this specification, the inverted clock and the non-inverted clock are often referred as a clock and this clock is input to the clock input of the inverter having a clock input. When these clock pulses do not enter, these two transistors are kept in high impedance state and disconnected from the data holding circuit 3 provided on the next stage. In this case, a short circuit current never flows in the PMOS transistor 21 and the NMOS transistor 24 forming the inverter irrespective of the voltage values of signals input to the transistors 21 and 24.

Then, when the clock pulse enters the PMOS output enable transistor 22 and the NMOS output enable transistor 23, the PMOS transistor 21 and the NMOS transistor 24 serve as an ordinary inverter to invert and output the signals input from the pass-transistor logic circuit 1. The value of the output signal replaces a signal value which has already been held by the data holding circuit 3 provided on the next stage. Thus, write to the data holding circuit 3 is completed.

Figure 8:
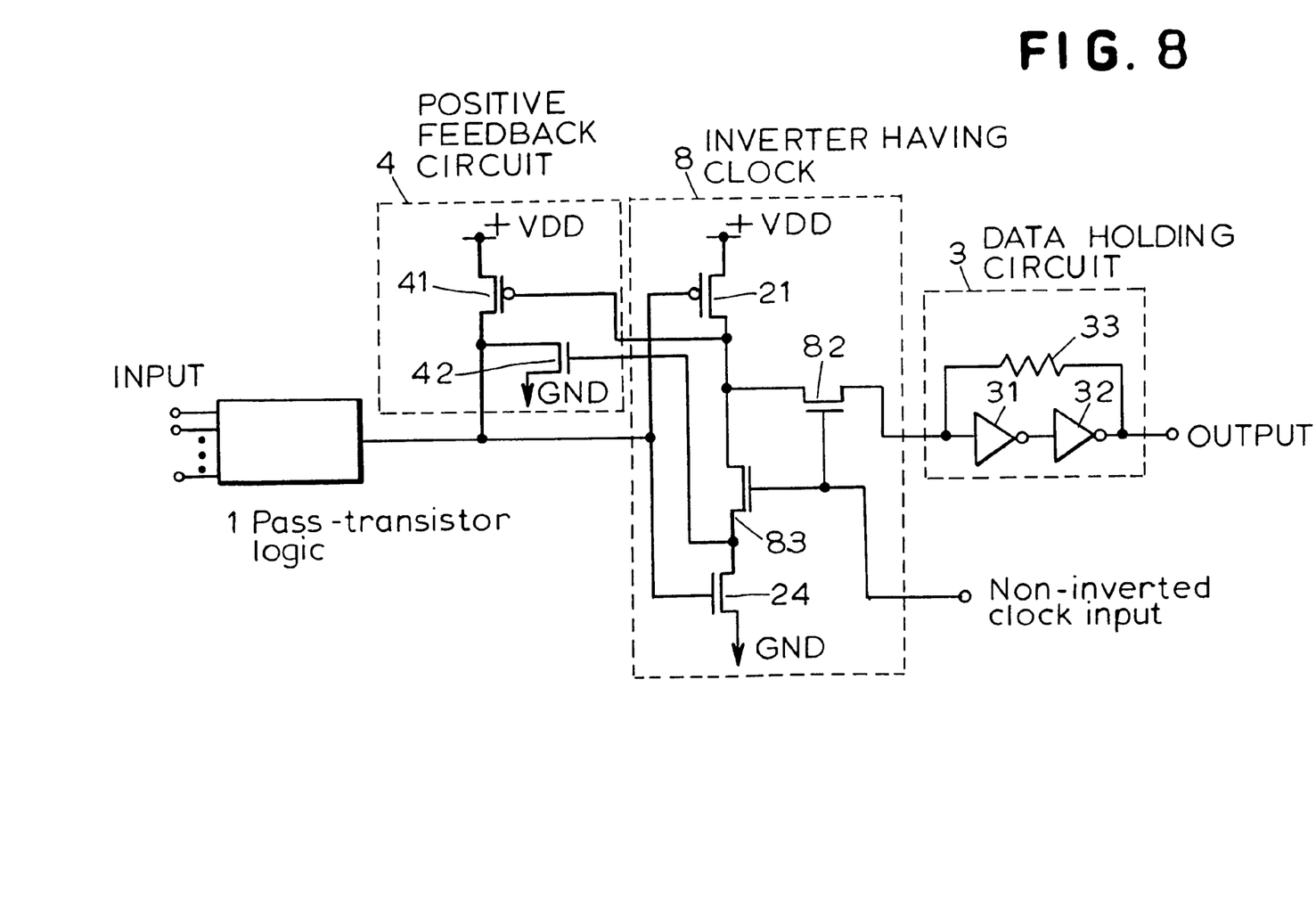
FIG. 8 is a circuit diagram showing another example of a low power consuming logic circuit which comprises a positive feedback circuit in accordance with the present invention.

An inverter 8 having a clock input shown in FIG. 8 can be used instead of the inverter 2 having a clock input shown in FIG. 3B. An example of the circuit of the inverter 8 having a clock input will be described below with reference to FIG. 8. A PMOS transistor 21 and an NMOS transistor 24 form an inverter circuit in the same manner as in FIG. 3B. In the present example, a first NMOS output enable transistor 83 is connected between the transistors 21 and 24 in series, and a second NMOS output enable transistor 82 is connected to the outputs of the first output enable transistor 83 and the PMOS transistor 21. The first and second output enable transistors 83 and 82 serve as switches which are closed when a non-inverted clock pulse enters, and form write control means. When the clock pulse does not enter, the NMOS transistor 83 is kept in the high impedance state and the inverter including the PMOS transistor 21 and the NMOS transistor 24 is brought into the non-operation state. Since the second NMOS output enable transistor 82 is kept in the high impedance, it is disconnected from a data holding circuit 3 provided on the next stage. In this case, a short circuit current never flows in the PMOS transistor 21 and the NMOS transistor 24 forming an inverter irrespective of the value of the voltage of a signal input thereto.

Then, when the clock pulse enters the first NMOS output enable transistor 83 and the second NMOS output enable transistor 82, the PMOS transistor 21 and the NMOS transistor 24 serve as an ordinary inverter to invert and output a signal input from the pass-transistor logic circuit 1. The value of the output signal replaces a signal value which has already been held by the data holding circuit 3 provided on the next stage. Thus, write to the data holding circuit 3 is completed. The function of the inverter 8 having a clock input is the same as that of the inverter 2 having a clock input, although the inverter 8 does not need an inverted clock is not used.

The data holding circuit 3 can be formed by CMOS inverters 31 and 32 and a resistor 33. The reason why a register 103 according to the prior art shown in FIG. 7 is not used but the data holding circuit 3 is used is as follows. When a clock pulse is not input so that the output of the inverter 2 having a clock input is brought into the non-connected state, the data holding circuit 3 has no problem but the register 103 operates unstably and requires another write clock, so that the consumed power is increased.

Figure 10:
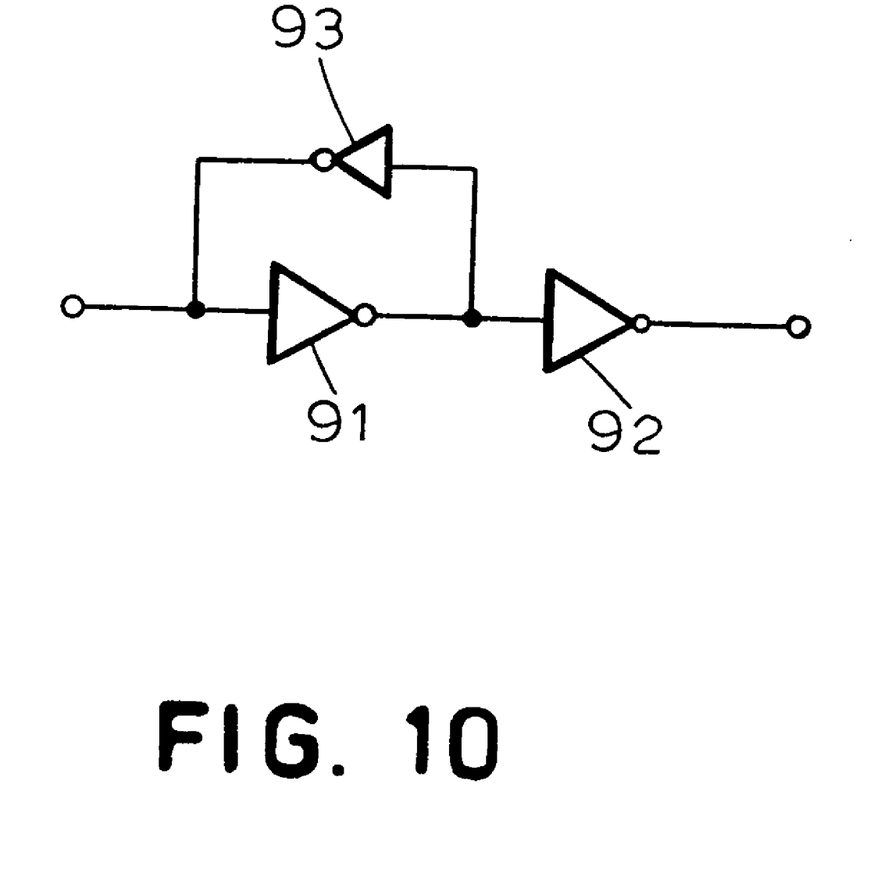
FIG. 10 is a diagram showing another structure of the data holding circuit.

The data holding circuit 3 can be implemented by a data holding circuit 90 having a circuit shown in FIG. 10 instead of the circuit shown in FIG. 3B. More specifically, the data holding circuit 90 is formed by connecting two inverters 91 and 93 like a loop and further connecting the output of the inverter 91 to an inverter 92. In the data holding circuit 90, the inverter 93 has smaller driving capability than that of the inverters 91 and 92.

The description will be given to a short circuit current which flows when a clock pulse is input to the PMOS transistor 21 and the NMOS transistor 24 to serve as an inverter. The short circuit current flows in the inverter only when the voltage of a signal input to the inverter has an intermediate value which is neither sufficiently high nor low. Strictly, only when the voltage of the input signal is lower than a threshold voltage of the PMOS transistor 21 and is higher than that of the NMOS transistor 24, the short circuit current flows. Accordingly, as the voltage of the input signal rises or drops slowly, the time for which the voltage of the input signal has the intermediate value is increased rapidly. For this reason, the time for which the short circuit current flows is increased proportionally. According to the present invention, only when a clock is input to the PMOS output enable transistor 22 and the NMOS output enable transistor 23, the short circuit current flows. Thus, the consumed power can be reduced.

An example of the positive feedback circuit 4 shown in FIG. 3B will be described below. The positive feedback circuit 4 can be formed by a PMOS transistor 41 and an NMOS transistor 42. The PMOS transistor 41 is connected to a power supply (+VDD) and an output 1a of a pass-transistor logic circuit 1. The NMOS transistor 42 is connected to the output 1a of the pass-transistor logic circuit 1 and a ground (GND). An output from a PMOS transistor 21 of an inverter 2 having a clock input is connected to the gate of the PMOS transistor 41. It is a characteristic of this example that the signal from a connected point of the NMOS output enable transistor 23 of the inverter 2 having a clock input and the NMOS transistor 24 is connected to the gate of the NMOS transistor 42. By this structure, only when a clock pulse enters the PMOS output enable transistor 22 and the NMOS output enable transistor 23 of the inverter 2 having a clock input, the PMOS transistor 41 and the NMOS transistor 42 operate. In the case where the pass-transistor logic circuit 1 is formed by only the NMOS pass-transistor and the voltage waveform of its output signal falls fast and rises slowly, the positive feedback circuit 4 can be formed by using only the PMOS transistor 41.

The description will be given to a method for using the logic circuit shown in FIGS. 3A and 3B and the whole circuit operation.

First of all, the method for using the circuit having no positive feedback circuit shown in FIG. 3A and the whole circuit operation will be described below.

When the input of a pass-transistor logic circuit 1 is changed, the voltage of the output signal of the pass-transistor logic circuit 1 starts to rise or fall slowly after a certain lag time passes, and then finally reaches a sufficiently high or low voltage through an intermediate voltage value. At the time when such state is reached, the output of the pass-transistor logic circuit 1 is defined. After the output of the pass-transistor logic circuit 1 is defined, a signal is given to the clock input of an inverter 2 having a clock input. More specifically, an inverted clock is sent to a PMOS output enable transistor 22 and a non-inverted clock is given to an NMOS output enable transistor 23. Consequently, the PMOS output enable transistor 22 and the NMOS output enable transistor 23 are brought into the conducting state. As a result, a PMOS transistor 21 and an NMOS transistor 24 start to operate as an inverter circuit. The inverter circuit inverts and amplifies the output of the pass-transistor logic circuit 1, and outputs the inverted and amplified signal to the connected point of the PMOS output enable transistor 22 and the NMOS output enable transistor 23. This output forcibly rewrites a signal value held by a data holding circuit 3 provided on the next stage. In this example, after the voltage of the output signal of the pass-transistor logic circuit 1 is set to a sufficiently high or low value (i.e. after defined), a clock input signal is given. Consequently, a current never flows through the PMOS transistors 21 and 22 and the NMOS transistors 23 and 24 which form the inverter having a clock input. Accordingly, power consumption which is based on the short circuit current is eliminated. Thus, it is possible to implement a low power consuming logic circuit in which the consumed power is reduced.

The method for using the logic circuit according to the example shown in FIG. 3B and the whole circuit operation will be described below.

When the input of the pass-transistor logic circuit 1 is changed, the voltage of an output signal starts to be slowly changed slightly later and passes through an intermediate value so that an output tries to be defined. While the voltage of the output signal has the intermediate value before the output of the pass-transistor logic circuit 1 is defined, a clock input signal is given to the inverter 2 having a clock input. More specifically, an inverted clock is given to the PMOS output enable transistor 22 and a non-inverted clock is given to the NMOS output enable transistor 23. It is necessary for the intermediate value of the voltage of the output signal to exceed a certain threshold and approximate the final value of the voltage of the output signal. The threshold is the input threshold of the inverter circuit. When a clock input is given, the PMOS output enable transistor 22 and the NMOS output enable transistor 23 are brought into conducting state. As a result, the PMOS transistor 21 and the NMOS transistor 24 start to operate as an inverter circuit. The inverter circuit compares the voltage of the output signal of the pass-transistor logic circuit 1 which has the intermediate value with the input threshold of the inverter to decide whether the voltage is high or low, and inverts and amplifies the signal to be output. This output appears on the connected point of the PMOS output enable transistor 22 and the NMOS output enable transistor 23, and rewrites a signal value held by the data holding circuit 3. In this example, the inverter 2 having a clock input starts to operate while the voltage of the output signal of the pass-transistor logic circuit 1 has the intermediate value. For this reason, a short circuit current flows in the inverter 2 having a clock input through the PMOS transistors 21 and 22 and the NMOS transistors 23 and 24.

However, the positive feedback circuit 4 also starts to operate at the same time that the inverter 2 having a clock input starts to operate. The positive feedback circuit 4 functions to further increase the voltage of the output signal of the pass-transistor logic circuit 1 if it is higher than the input threshold of the inverter, and to reduce the voltage if it is lower than the input threshold of the inverter. After the value of the voltage of the output signal of the pass-transistor logic circuit 1 is slowly changed to exceed the input threshold of the inverter, the positive feedback circuit 4 starts to operate. Accordingly, the positive feedback circuit 4 serves to increase the speed at which the voltage of the output signal of the pass-transistor logic circuit 1 is changed slowly. Consequently, the value of the voltage of the output signal is rapidly changed from the intermediate value to the final value. Thus, the short circuit current flows in the inverter 2 having a clock input for a very short time. Accordingly, the power consumption which is based on the short circuit current can be reduced. As a result, it is possible to implement a low power consuming logic circuit which solves the above-mentioned problems.

Another example of the low power consuming logic circuit according to the present invention will be described below.

Figure 5A:
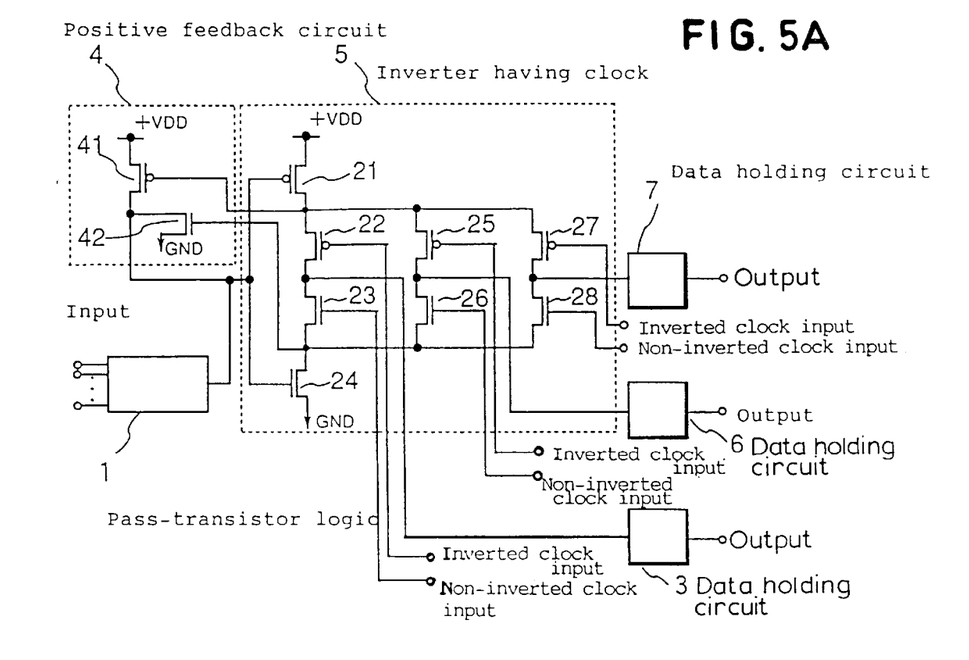
FIG. 5A is a diagram showing a low power consuming logic circuit which has an inverter circuit, a plurality of write control means and a plurality of data holding circuits according to an example of the present invention.

A circuit shown in FIG. 5A is obtained by adding, to the circuit shown in FIG. 3B, a PMOS output enable transistor 25, an NMOS output enable transistor 26 and a data holding circuit 6 to be connected thereto, and a PMOS output enable transistor 27, an NMOS output enable transistor 28 and a data holding circuit 7 to be connected thereto. The PMOS output enable transistor 25 and the NMOS output enable transistor 26 form write control means. Similarly, the PMOS output enable transistor 27 and the NMOS output enable transistor 28 form write control means. The circuit structure according to the present example is formed by expanding the example shown in FIG. 3B so as to correspond to the case where there are a plurality of registers to be written with a signal obtained by inverting a logic signal generated from the pass-transistor logic circuit 1. The operation of PMOS output enable transistors 22, 25 and 27 shown in FIG. 5A is the same as that of the PMOS output enable transistor 22 shown in FIG. 3B. The operation of NMOS output enable transistors 23, 26 and 28 shown in FIG. 5A is the same as that of the NMOS output enable transistor 23 shown in FIG. 3B. For example, if an inverted clock is given to the PMOS output enable transistor 27 and a non-inverted clock is given to the NMOS output enable transistor 28, the transistors 27 and 28 are brought into a conducting state. Consequently, the PMOS transistor 21 and the NMOS transistor 24 start to operate as an ordinary inverter circuit. The output of the inverter circuit appears on the connected point of the PMOS output enable transistor 27 and the NMOS output enable transistor 28, and rewrites a signal value held by the data holding circuit 7 which is directly connected to the same point. The above-mentioned operation is performed in just the same manner for a set of the PMOS output enable transistor 25 and the NMOS output enable transistor 26 and a set of the PMOS output enable transistor 22 and the NMOS output enable transistor 23. More specifically, the structure and operation of the circuit for other portions are just the same as those of FIG. 3B except that write to any of the data holding circuits 3, 6 and 7 is determined depending on the input of a signal to any of three sets of write control means. In order to reduce the short circuit current, consequently, it is sufficient that just the same operation as in the example of FIG. 3A is performed as to the timing for giving the clock input when the voltage of the output signal of the pass-transistor logic circuit 1 is changed.

Figure 9:
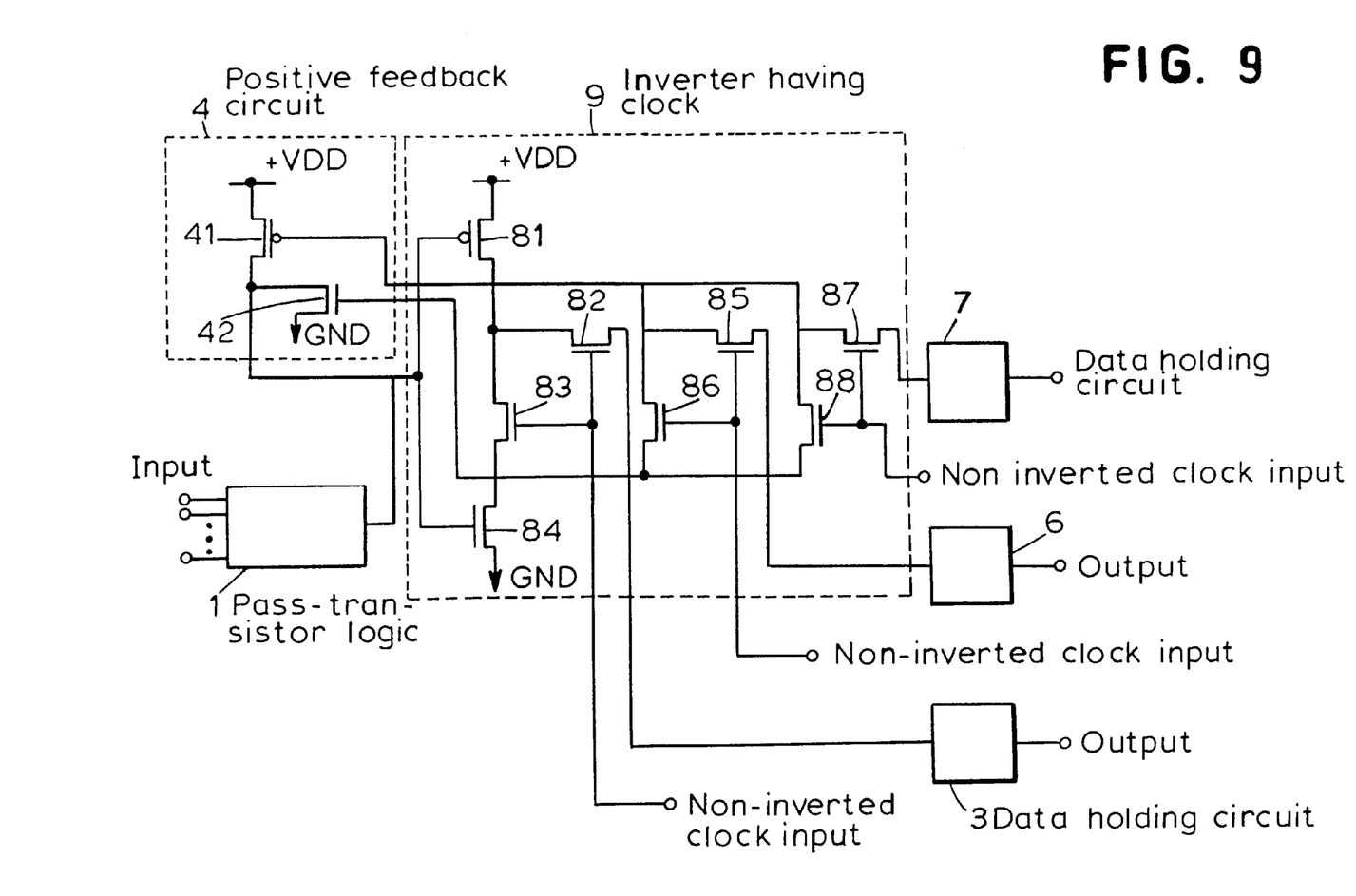
FIG. 9 is a diagram showing a low power consuming logic circuit which comprises an inverter circuit, a plurality of write control means and a plurality of data holding circuits according to an example of the present invention.

An inverter 9 having a clock input shown in FIG. 9 can be used instead of the inverter 5 having a clock input shown in FIG. 5A. The structure of a circuit shown in FIG. 9 is formed by adding, to the circuit shown in FIG. 8, a first NMOS output enable transistor 86, a second NMOS output enable transistor 85, and a data holding circuit 6 connected to the second NMOS output enable transistor 85, and a first NMOS output enable transistor 88, a second NMOS output enable transistor 87 and a data holding circuit 7 connected to the second NMOS output enable transistor 87. The first NMOS output enable transistor 86 and the second NMOS output enable transistor 85 form write control means. Similarly, the first PMOS output enable transistor 88 and the second NMOS output enable transistor 87 form write control means. The function of the inverter 9 having a clock input is the same as that of the inverter 5 having a clock input shown in FIG. 5A except that an inverted clock is not used.

Figure 5B:
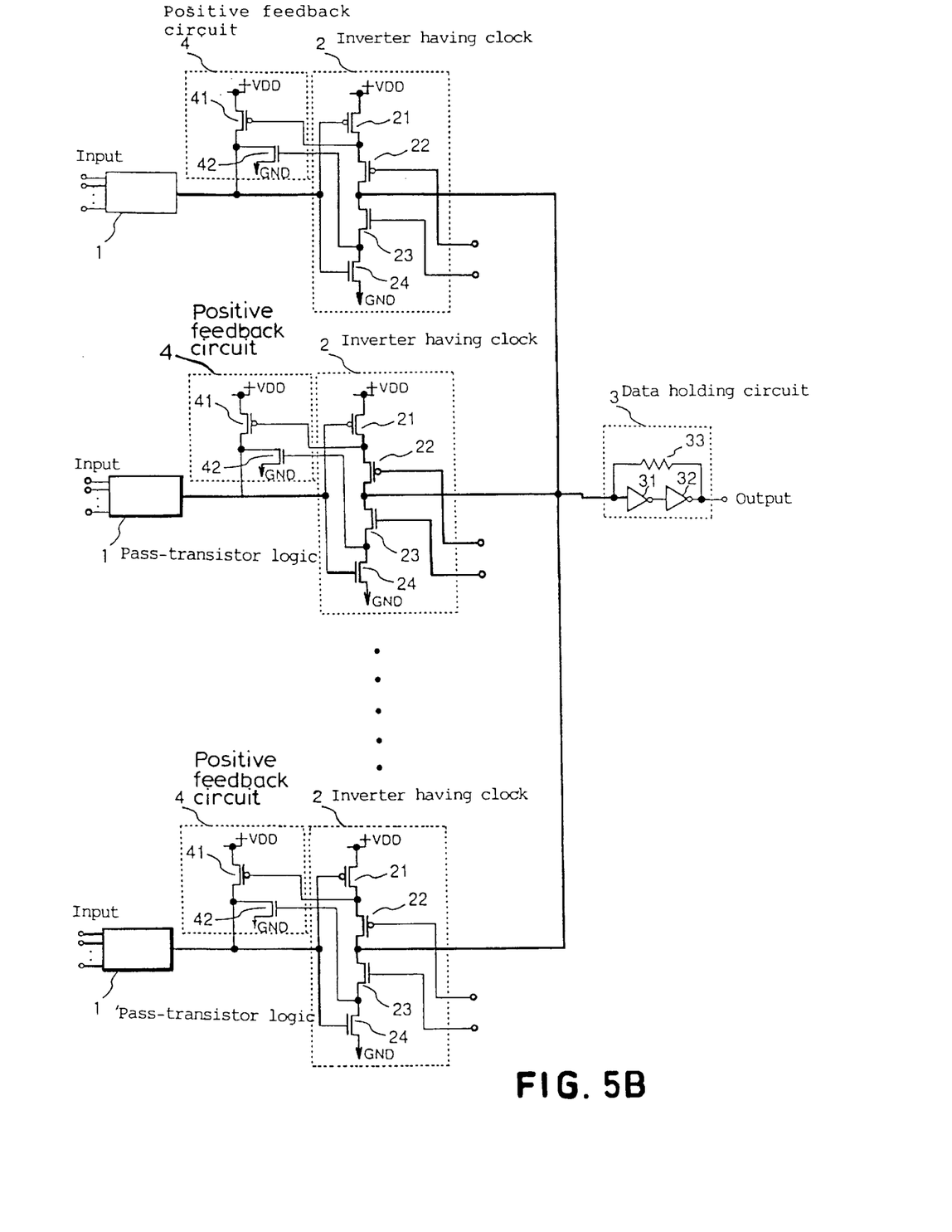
FIG. 5B is a diagram showing a low power consuming logic circuit according to an example of the present invention, in which circuits including a plurality of pass-transistor logics, a plurality of positive feedback circuits and a plurality of inverters having clock inputs are connected to a data holding circuit.

A further example of the present invention is shown in FIG. 5B. In this example, a plurality of logic circuits having the structure shown in FIG. 3B are prepared except for the data holding circuit 3, the outputs of the inverters 2 having a clock input which are included in the respective logic circuits are connected to one another and are connected to the input of only one data holding circuit 3. The logic circuit according to this example has a structure which is used in the case where data should be transferred from any of different logic circuits to only one register. The logic circuit according to this example is operated in just the same manner as the logic circuit shown in FIG. 3B so long as data is not written from the logic circuits to the data holding circuit 3 at the same time.

The circuit shown in FIG. 5B can also have a structure in which each positive feedback circuit 4 is not provided. Furthermore, the NMOS output enable transistors 82 and 83 shown in FIG. 8 can also be used instead of a PMOS output enable transistor 22 and an NMOS output enable transistor 23.

In addition, the low power consuming logic circuit shown in FIGS. 3A, 3B, 5A, 5B, 8 and 9 can be connected to one another to form a larger logic circuit having cascade connection.

According to the present invention, a pass-transistor logic circuit having pass-transistors connected in multi-stage can be used as a low power consuming logic circuit. According to a conventional method, such a pass-transistor logic could not be used to obtain low power consumption because a great short circuit current is generated on a CMOS inverter connected to the next stage. According to the present invention, the pass-transistor logic can be used to obtain the low power consumption by reducing the short circuit current. As compared with the prior art, the pass-transistor logic having pass-transistors connected in multistage removes the CMOS inverter provided in the middle thereof so that a great effect on a reduction in power consumption can be obtained. As compared with the prior art, the number of transistors to be used for the CMOS inverter and the short circuit current which flows in the CMOS inverter can be decreased so that the consumed power can be reduced greatly. According to the present invention, consequently, it is possible to obtain a low power consuming logic circuit in which power consumption is reduced more greatly than in the prior art.

According to the present invention, the clock for an inverter having a clock input also serves as a write control signal to control the writing to a data holding circuit. Consequently, a simple data holding circuit can be used instead of a register according to the prior art. Also in this stage, the effect on a reduction in power consumption can be obtained by reducing the number of transistors.

According to the present invention, the total number of transistors forming a logic circuit can be decreased more than in the prior art. Consequently, the chip area of a LSI can be decreased so that manufacturing cost can be reduced.

Furthermore, a circuit structure according to the present invention is suitable for the design of a digital system in which a common bus is removed, and is effective in the case where power consumption caused by charging and discharging of the common bus should be reduced. A circuit using the common bus will be briefly described below. In the exemplary circuit, the output portion of an inverter 2 having a clock input provided on the latter stage of a pass-transistor logic circuit 1 is connected to a special signal line, that is, the common bus, which is also utilized in common by circuits of other circuit blocks with time sharing. A plurality of registers having write control signal lines are connected to the back stage of the common bus instead of the data holding circuit. The common bus is utilized in common so that there is a high probability that a signal value is varied. Consequently, the common bus is charged and discharged frequently so that the consumed power tends to be increased. According to the present invention, for example, an inverter 2 or 8 having a clock input and a data holding circuit 3, or an inverter 5 or 9 having a clock input and a data holding circuit 3, 6, or 7 are directly connected without the common bus. Therefore, wasteful power consumption can be prevented from occurring due to the charging and discharging of the bus.

What is claimed is:

1. A low power consuming logic circuit comprising:
    a pass-transistor logic circuit having MOS type pass-transistors interconnected;
    an inverter having a clock input connected to the output of said pass-transistor logic circuit; and
    a data holding circuit connected to the output of said inverter having a clock input;
    wherein a clock which is input to said inverter having a clock input is used both as an enabling inverter function of said inverter having a clock input and as a write control signal to said data holding circuit.

2. The low power consuming logic circuit according to claim 1, wherein the inverter having a clock input includes:
    a PMOS transistor and an NMOS transistor which are connected to the output of the pass-transistor logic circuit and function as an inverter; and
    write control means which is provided between said PMOS transistor and said NMOS transistor and has a PMOS output enable transistor and an NMOS output enable transistor, wherein the outputs of said PMOS output enable transistor and said NMOS output enable transistor are connected as the output of said inverter having a clock input, and the output of the pass-transistor logic circuit is inverted and output as the output of said inverter having a clock input to the data holding circuit when an inverted clock is input to the PMOS output enable transistor and a non-inverted clock is input to the NMOS output enable transistor.

3. The low power consuming logic circuit according to claim 1, wherein the inverter having a clock input includes:

a PMOS transistor and an NMOS transistor which are connected to the output of said pass-transistor logic circuit and function as an inverter; and write control means having a first NMOS output enable transistor provided between said PMOS transistor and said NMOS transistor, and a second NMOS output enable transistor connected to the output of said PMOS transistor and the output of said first NMOS output enable transistor, wherein the outputs of said second NMOS output enable transistor and said first NMOS output enable transistor are connected as the output of said inverter having a clock input, and the output of said pass-transistor logic circuit is inverted and output as the output of said inverter having a clock input to said data holding circuit when a non-inverted clock is input to said first NMOS output enable transistor and said second NMOS output enable transistor.

4. A low power consuming logic circuit comprising:

a pass-transistor logic circuit having MOS type pass-transistors interconnected;

an inverter having a clock input which is connected to said output of the pass-transistor logic circuit and has a plurality of outputs; and a plurality of data holding circuits connected to said plurality of outputs of the inverter having a clock input, respectively, wherein a clock which is input to said inverter having a clock input is used as a write control signal sent from the plurality of outputs of said inverter having a clock input to said plurality of data holding circuits.

5. The low power consuming logic circuit according to claim 4, wherein said inverter having a clock input includes:

a PMOS transistor and an NMOS transistor which are connected to the output of the pass-transistor logic circuit and function as an inverter; and a plurality of write control means connected between the PMOS transistor and the NMOS transistor in parallel, each of which has a PMOS output enable transistor and an NMOS output enable transistor connected in series, wherein the respective outputs of said PMOS output enable transistors and said NMOS output enable transistors of the respective write control means are connected as a plurality of outputs of said inverter having a clock input, and the output of the pass-transistor logic circuit is inverted and output as the output of said inverter having a clock input to said data holding circuit when an inverted clock is input to said PMOS output enable transistor and a non-inverted clock is input to the NMOS output enable transistor in each of the write control means.

6. The low power consuming logic circuit according to claim 4, wherein the inverter having a clock input includes:

a PMOS transistor and an NMOS transistor which are connected to the output of the pass-transistor logic circuit and function as an inverter; and a plurality of write control means, each having a first NMOS output enable transistor connected between the PMOS transistor and the NMOS transistor in parallel, and a second NMOS output enable transistor connected to the output of the PMOS transistor and that of the first NMOS output enable transistor, wherein the outputs of the respective second NMOS output enable transistors are connected as the outputs of the inverter having a clock input, and the output of the pass-transistor logic circuit is inverted and output as the output of the inverter having a clock input to the data holding circuit when a non-inverted clock is input to the first NMOS output enable transistor and the second NMOS output enable transistor in the write control means.

7. The low power consuming logic circuit according to claim 2, further comprising a positive feedback circuit for supplying an inverted signal to the input of the inverter having a clock input on the basis of the output of said PMOS transistor and the output of said NMOS transistor of said inverter having a clock input.

8. The low power consuming logic circuit according to claim 7, wherein the outputs of said PMOS output enable transistor and said NMOS output enable transistor are connected to said positive feedback circuit, and the output of the pass-transistor logic circuit is inverted and output as the output of the inverter having a clock input to said positive feedback circuit when an inverted clock is input to said PMOS output enable transistor and a non-inverted clock is input to said NMOS output enable transistor.

9. The low power consuming logic circuit according to claim 3, further comprising a positive feedback circuit for supplying an inverted signal to the input of the inverter having a clock input on the basis of the output of said PMOS transistor and the output of said NMOS transistor of said inverter having a clock input.

10. The low power consuming logic circuit according to claim 7, wherein the outputs of said PMOS transistor and said first NMOS output enable transistor are connected to said positive feedback circuit, and the output of the pass-transistor logic circuit is inverted and output as the output of the inverter having a clock input to said positive feedback circuit when a non-inverted clock is input to the first NMOS output enable transistor and the second NMOS output enable transistor.

11. A low power consuming logic circuit, comprising;

a pass-transistor logic circuit having MOS type pass-transistors interconnected;

an inverter having a clock input which is connected to the output of the pass-transistor logic circuit and has a plurality of outputs;

a positive feedback circuit for inverting the output of said inverter having a clock input and outputting the inverted signal to the input of the inverter having a clock input; and a plurality of data holding circuits connected to the plurality of outputs of the inverter having a clock input, respectively, wherein a clock input to the inverter having a clock input is used as a write control signal for writing from the plurality of outputs of the inverter having a clock input to the plurality of data holding circuit, and said clock input to the inverter having a clock input is used as feedback control signal for feedback from the output of said inverter having a clock input to the input of said inverter.

12. The low power consuming logic circuit according to claim 11, wherein the inverter having a clock input includes:

a PMOS transistor and an NMOS transistor which are connected to the outputs of the pass-transistor logic circuit and function as an inverter; and a plurality of write control means connected between said PMOS transistor and said NMOS transistor in parallel, each of which has a PMOS output enable transistor and an NMOS output enable transistor connected in series, wherein the output of said PMOS transistor and the output of said NMOS transistor are input to said positive feedback circuit, the respective outputs of the PMOS output enable transistors and the NMOS output enable transistors in the respective write control means are connected to the respective data holding circuits, and when an inverted clock is input to the PMOS output enable transistor and a non-inverted clock is input to the NMOS output enable transistor in the write control means, the output of said PMOS transistor and the output of said NMOS transistor are output as the output of said plurality of inverters having a clock input to the data holding circuits and are output to said positive feedback circuit.

13. The low power consuming logic circuit according to claim 11, wherein the inverter having a clock input includes:

a PMOS transistor and an NMOS transistor which are connected to the outputs of the pass-transistor logic circuit and function as an inverter; and a plurality of write control means, each having a first NMOS output enable transistor connected between the PMOS transistor and the NMOS transistor in parallel, and a second NMOS output enable transistor connected to the output of the PMOS transistor and the output of the first NMOS output enable transistor, wherein the output of the PMOS transistor and the output of the NMOS transistor are input to said positive feedback circuit, the outputs of the respective second NMOS output enable transistors are connected to the respective data holding circuits, and when a non-inverted clock is input to the first NMOS output enable transistor and the second NMOS output enable transistor in the write control means, the output of said PMOS transistor and the output of said NMOS transistor are output as the output of the inverter having a clock input to the data holding circuit and are output to said positive feedback circuit.

* * * * *